(12) United States Patent
Acik et al.

(10) Patent No.: US 11,203,817 B2
(45) Date of Patent: Dec. 21, 2021

(54) ONE-STEP IN SITU SOLUTION GROWTH FOR LEAD HALIDE PEROVSKITE

(71) Applicant: UCHICAGO ARGONNE, LLC, Chicago, IL (US)

(72) Inventors: Muge Acik, Lisle, IL (US); Seth B. Darling, Chicago, IL (US)

(73) Assignee: UChicago Argonne, LLC, Chicago, IL (US)

( * ) Notice: Subject to any disclaimer, the term of this patent is extended or adjusted under 35 U.S.C. 154(b) by 131 days.

(21) Appl. No.: 15/640,268

(22) Filed: Jun. 30, 2017

(65) Prior Publication Data

US 2019/0003074 A1 Jan. 3, 2019

(51) Int. Cl.

| | | |
|---|---|---|
| *C30B 7/04* | (2006.01) |
| *H01G 9/20* | (2006.01) |
| *C30B 29/12* | (2006.01) |
| *C30B 7/14* | (2006.01) |
| *H01L 51/00* | (2006.01) |
| *H01L 51/42* | (2006.01) |
| *H01L 51/50* | (2006.01) |

(52) U.S. Cl.
CPC .................. *C30B 7/04* (2013.01); *C30B 7/14* (2013.01); *C30B 29/12* (2013.01); *H01G 9/2059* (2013.01); *H01L 51/005* (2013.01); *H01L 51/0007* (2013.01); *H01L 51/42* (2013.01); *H01L 51/5012* (2013.01)

(58) Field of Classification Search
CPC .. C30B 7/04; C30B 7/14; C30B 29/12; H01L 51/005; H01L 51/0007; H01L 51/5012; H01L 51/42; H01G 9/2059
See application file for complete search history.

(56) References Cited

U.S. PATENT DOCUMENTS

| | | | |
|---|---|---|---|
| 5,871,579 A | 2/1999 | Liang et al. | |
| 9,895,714 B2 | 2/2018 | Moore et al. | |
| 2008/0015240 A1* | 1/2008 | Teramoto | C07D 409/06 514/395 |
| 2015/0263201 A1* | 9/2015 | Chaudhari | H01L 31/03926 136/258 |
| 2017/0152608 A1* | 6/2017 | Jin | C30B 7/14 |
| 2017/0322323 A1* | 11/2017 | Fischer | G01T 1/2006 |
| 2017/0338045 A1* | 11/2017 | Vak | H01L 51/0004 |
| 2017/0358757 A1* | 12/2017 | Lee | C09K 11/02 |
| 2018/0286923 A1* | 10/2018 | Fischer | G21K 4/00 |

FOREIGN PATENT DOCUMENTS

CN 105405979 A * 3/2016 ............. H01L 51/42

OTHER PUBLICATIONS

Fu et al, Solution Growth of Single crystal methylammonium lead halide perovskite nanostructures for optoelectronic and photovoltaic applications, 2015, Journal of American Chemical Society, 137, p. 5810-5818 (Year: 2015).*

European Patent Office, English computer translation of CN 105405979(A) (Year: 2019).*

(Continued)

*Primary Examiner* — Matthew J Song

(74) *Attorney, Agent, or Firm* — Foley & Lardner LLP

(57) ABSTRACT

A method of forming lead halide perovskite crystals in a solvent. The perovskite is form by solution processing of an organic and inorganic precursor in a polar protic solvent.

15 Claims, 14 Drawing Sheets

(56) References Cited

OTHER PUBLICATIONS

Acik & Darling, "Graphene in perovskite solar cells: device design, characterization and implementation," Journal of Materials Chemistry A 4, pp. 6185-6235 (2016).

Acik, et al., "Unusual infrared-absorption mechanism in thermally reduced graphene oxide," Nature Materials 9, pp. 840-845 (2010).

Chen, et al., "One-step, low-temperature deposited perovskite solar cell utilizing small molecule additive," Journal of Photonics for Energy 5(1), 057405, 8 pages (2015).

Fu, et al., "Solution Growth of Single Crystal Methylammonium Lead Halide Perovskite Nanostructures for Optoelectronic and Photovoltaic Applications," Journal of the American Chemical Society 137(17), pp. 5810-5818 (2015).

Gong, et al., "Perovskite photovoltaics: life-cycle assessment of energy and environmental impacts," Energy & Environmental Science 8, pp. 1953-1968 (2015).

Maculan, et al., "CH3NH3PbCl3 Single Crystals: Inverse Temperature Crystallization and Visible-Blind UV-Photodetector," Journal of Physical Chemistry Letters 6(19), pp. 3781-3786 (2015).

Tian, et al., "Visualizing Carrier Diffusion in Individual Single-Crystal Organolead Halide Perovskite Nanowires and Nanoplates," Journal of the American Chemical Society 137(39), pp. 12458-12461 (2015).

Wu, et al., "Efficient planar heterojunction perovskite solar cells employing graphene oxide as hole conductor," Nanoscale 6, pp. 10505-10510 (2014).

Yeo, et al., "Highly efficient and stable planar perovskite solar cells with reduced graphene oxide nanosheets as electrode interlayer," Nano Energy 12, pp. 96-104 (2015).

Zhang, et al., "Ultrasmooth organic-inorganic perovskite thin-film formation and crystallization for efficient planar heterojunction solar cells," Nature Communications 6, 6142, 10 pages (2015).

Liang, et al., "Synthesis and Characterization of Organic-Inorganic Perovskite Thin Films Prepared Using a Versatile Two-Step Dipping Technique," Chemistry of Materials 10(1), pp. 403-411 (1998).

Moore, et al., "Direct Crystallization Route to Methylammonium Lead Iodide Perovskite from an Ionic Liquid," Chemistry of Materials 27(9), pp. 3197-3199 (2015).

\* cited by examiner

ONE-STEP IN SITU SOLUTION GROWTH FOR LEAD HALIDE PEROVSKITE

STATEMENT OF GOVERNMENT INTEREST

The United States Government claims certain rights in this invention pursuant to Contract No. W-31-109-ENG-38 between the United States Government and the University of Chicago and/or pursuant to DE-AC02-06CH11357 between the United States Government and UChicago Argonne, LLC representing Argonne National Laboratory.

TECHNICAL FIELD

The present disclosure relates generally to methods for perovskite formation and materials utilizing perovskites.

BACKGROUND

Perovskite structures ("perovskites") have been an area of focus for possible improved photovoltaics, light emitting diodes, water splitting photocatalysts, photodetectors, lasers and thermoelectrics. Perovskite photovoltaic devices typically include perovskite layers sandwiched between electron and hole transporter layers. Current conventional perovskite deposition methods for fabricating a perovskite solar cell device as an alternative application approach typically include the introduction of the perovskite layer on an electron transport layer (ETL: $TiO_2$, etc.) by spin coating of the precursors, first mixed in dimethyl formamide (DMF) solvent as a one-step approach or by using a two-step approach where methylammonium halide in 2-propanol is spin-coated first at room temperature, and then followed by a sequential spin-coating of lead halide in DMF. For both deposition techniques, next step involves removal of the solvent on a hot plate by annealing at temperatures reported in a range of 60-130° C. to grow and orient methylammonium lead halide perovskite crystals on an ETL. In other words, the traditional perovskite growth is performed with deposition on an oxide-based electron transport layer as a thin film, followed by a hot plate annealing. Apart from these two common methods, other conventional perovskite growth methods involve toluene dripping (spreading the solvent through the layers with a follow-up spin-coating over a spin-coated precursor), in situ dipping (dipping of a spin-coated precursor on substrate into the solution of other precursor), vapor-phase deposition (generation of vapor phase of the precursors with high temperature heating), or introduction of an inorganic layer over an organic layer by sequential deposition techniques (exposure of the organic precursor vapor over a coated surface of the inorganic precursor on a substrate). However, these techniques require annealing to grow perovskite, which alters the ETL properties due to heating. Especially, when the electron transport layer is an oxide such as Graphene/Graphite Oxide, annealing results in reduction (i.e. oxygen removal takes place upon annealing leading to a band gap modification) or chemical reactions occur between DMF and GO/RGO tailoring the structural composition and the film interfaces in the process of perovskite formation. The result is ineffective operation of the solar cell devices with designs having uncontrolled compositions in each layer leading to interfacial chemical reactions, which cause low solar cell power efficiency, poor stability and device failure.

One of the process improvement to provide excellent film uniformity on the substrate anneals was shown by Zhang et al. (Nature Commun. 6:6142 (2015)). This work introduced the use of a non-halide lead source such as lead acetate instead of lead halides to enhance the perovskite growth on the substrates leading to the smooth and pinhole-free perovskite films. Although the study proved a uniform film formation providing excess organic component during crystallization of the perovskites, lead halides were eliminated in the process with a one-step few-minute annealing procedure, which was dependent on the degree of volatility of the excess organic component. If the volatilization was not enough, the film would need to be heated for a longer time, which could lead to film morphology coarsening. Excessive heat also challenged the stoichiometry control with the halide deficiencies leading to a high possibility of increased energetic disorder during perovskite crystallization over the substrate. Although the authors were able to reduce the necessary energy for the perovskite formation by choosing a higher volatility by-product salt (higher than the methylammonium halides), the resulting films showed the formation of pinholes that degraded the film uniformity and thus the quality and composition of the resulting perovskite. Other disadvantageous factor of using the excess organic component is entrapment of molecules at the film interfaces with ETLs during solar cell device fabrication.

Another work introduced the use of a small molecule, namely, I,3-Bis[3,5-di(pyridin-3-yl)phenyl] benzene (BmPyPhB) (Chen et al., J. Photonics for Energy, 057405 (2015)), following a one-step deposition of methylammonium iodide perovskites that allowed pre-crystallized domains prior to annealing. This small molecule led to the morphology control and formed an intermediate phase during perovskite growth on the substrates providing continuous and dense morphology by an enhanced crystal growth efficiency for a uniformity improvement of the resulting perovskite films. Although the growth process was improved by using a small molecule as the morphology controller during the growth process, this work did not eliminate the use of hot plate annealing for complete conversion of perovskite crystallization on the substrates. Fu et al. (J. Am. Chem. Soc. 2015, 137, 5810-5818) showed the improvements focusing on the single crystal methyl ammonium lead iodide or bromide perovskite formation using dissolution-recrystallization pathway in solution by varying the concentration of methylammonium halide precursor. This technique provided the use of lead iodide prepared in DMF leading to the films coated on the substrates, followed by further introduction of the methylammonium halide in 2-propanol (isopropyl alcohol, IPA), which resulted the formation of nanorods, nanobelts, nano platelets, and nanowires based on the precursor concentration control in solution. These single-crystal nanostructures were identified as n-type semiconductors, useful for both photovoltaic and optoelectronic devices. However, the method itself is still not substrate-free and the resulting perovskites are in nano scales that restrict the broad range of applicability of these synthesized materials.

A similar approach was also followed by Tian et al. (J. Am. Chem. Soc. 2015, 137, 12458-12461), in which $PbAc_2.3H_2O$ dimethylsulfoxide (DMSO) solution coated a film on a glass slide by further introducing into methyl ammonium halide solution in IPA. This work also provided information on methylammonium lead halide perovskite single-crystal growth in solution using substrate coatings, which results in formation on nanowires and nanoplates. To avoid high temperature annealing processes, solution-based methods have been developed, where the perovskite colloidal particles are synthesized in solution and then deposited on the underlayer film without further annealing.

For instance, methylammonium lead chloride single-crystal perovskite growth in solution was shown by Maculan et al. (J. Phys. Chem. Lett. 2015, 6, 3781-3786) by inverse temperature crystallization resulting in perovskite semiconductors for visible-blind UV photodetectors, which was prepared by introduction of the precursors directly into DMF/DMSO solution after 48 h in an oil bath at 50° C. for the growth mechanism. Although this method resembles our invention as a solution-processable technique for the production of lead halide perovskites, the resulting material was shown as a small piece of perovskite crystal that was not suitable for the large scale production. The technique was also shown only for methylammonium lead chloride perovskite crystal formation, which did not eliminate the use of high boiling point solvents such as DMF. Therefore, current studies with solution-processing reactions occur at high temperature and thus cannot avoid unmanageable surface reactions resulting in nonstoichiometric dopants and phase segregation ((a) Fu, Y.; Meng, F.; Rowley, M. B.; Thompson, B. J.; Shearer, M. J.; Ma, D.; Hamers, R. J.; Wright, J. C.; Jin, S., Solution Growth of Single Crystal Methylammonium Lead Halide Perovskite Nanostructures for Optoelectronic and Photovoltaic Applications. *J Am Chem Soc* 2015, 137 (17), 5810-5818; (b) Rosales, B. A.; Men, L.; Cady, S. D.; Hanrahan, M. P.; Rossini, A. J.; Vela, J., Persistent Dopants and Phase Segregation in Organolead Mixed-Halide Perovskites. *Chemistry of Materials* 2016.). In order to lower the reaction temperature, acid-treated methods such as acid-catalyzed techniques Dang, Y.; Liu, Y.; Sun, Y.; Yuan, D.; Liu, X.; Lu, W.; Liu, G.; Xia, H.; Tao, X., Bulk crystal growth of hybrid perovskite material CH3NH3PbI3. *Crystengcomm* 2015, 17 (3), 665-670.) and acid-base solutions (Nayak, P. K.; Moore, D. T.; Wenger, B.; Nayak, S.; Haghighirad, A. A.; Fineberg, A.; Noel, N. K.; Reid, O. G.; Rumbles, G.; Kukura, P.; Vincent, K. A.; Snaith, H. J., Mechanism for rapid growth of organic-inorganic halide perovskite crystals. *Nat Commun* 2016, 7, 13303.) are developed particularly for the mixed halides (Noel, N. K.; Abate, A.; Stranks, S. D.; Parrott, E. S.; Burlakov, V. M.; Goriely, A.; Snaith, H. J., Enhanced Photoluminescence and Solar Cell Performance via Lewis Base Passivation of Organic-Inorganic Lead Halide Perovskites. *Acs Nano* 2014, 8 (10), 9815-9821.) (Zhang, T.; Yang, M.; Benson, E. E.; Li, Z.; van de Lagemaat, J.; Luther, J. M.; Yan, Y.; Zhu, K.; Zhao, Y., A facile solvothermal growth of single crystal mixed halide perovskite CH3NH3Pb(Br1−xClx)3. *Chem Commun* 2015, 51 (37), 7820-7823.) and single halides ((a) Yang, Y.; Yan, Y.; Yang, M.; Choi, S.; Zhu, K.; Luther, J. M.; Beard, M. C., Low surface recombination velocity in solution-grown CH3NH3PbBr3 perovskite single crystal. *Nat Commun* 2015, 6, 7961; (b) Maculan, G.; Sheikh, A. D.; Abdelhady, A. L.; Saidaminov, M. I.; Haque, M. A.; Murali, B.; Alarousu, E.; Mohammed, O. F.; Wu, T.; Bakr, O. M., CH3NH3PbCl3 Single Crystals: Inverse Temperature Crystallization and Visible-Blind UV-Photodetector. *The Journal of Physical Chemistry Letters* 2015, 6 (19), 3781-3786.) in DMF. (Saidaminov, M. I.; Abdelhady, A. L.; Murali, B.; Alarousu, E.; Burlakov, V. M.; Peng, W.; Dursun, I.; Wang, L.; He, Y.; Maculan, G.; Goriely, A.; Wu, T.; Mohammed, O. F.; Bakr, O. M., High-quality bulk hybrid perovskite single crystals within minutes by inverse temperature crystallization. *Nat Commun* 2015, 6, 7586.) (Peng, W.; Wang, L.; Murali, B.; Ho, K.-T.; Bera, A.; Cho, N.; Kang, C.-F.; Burlakov, V. M.; Pan, J.; Sinatra, L.; Ma, C.; Xu, W.; Shi, D.; Alarousu, E.; Goriely, A.; He, J.-H.; Mohammed, O. F.; Wu, T.; Bakr, O. M., Solution-Grown Monocrystalline Hybrid Perovskite Films for Hole-Transporter-Free Solar Cells. *Adv Mater* 2016, 28 (17), 3383-3390.) (Tian, W.; Zhao, C.; Leng, J.; Cui, R.; Jin, S., Visualizing Carrier Diffusion in Individual Single-Crystal Organolead Halide Perovskite Nanowires and Nanoplates. *J Am Chem Soc* 2015, 137 (39), 12458-12461.) (Moore, D. T.; Tan, K. W.; Sai, H.; Barteau, K. P.; Wiesner, U.; Estroff, L. A., Direct Crystallization Route to Methylammonium Lead Iodide Perovskite from an Ionic Liquid. *Chem Mater* 2015, 27 (9), 3197-3199.) (Liang, K.; Mitzi, D. B.; Prikas, M. T., Synthesis and Characterization of Organic-Inorganic Perovskite Thin Films Prepared Using a Versatile Two-Step Dipping Technique. *Chem Mater* 1998, 10 (1), 403-411.) These acid-catalyzed reactions are, in general, initiated by the formation of solvated $PbI_4^{2-}$ anions that further react with $CH_3NH_3^+$ cations for $CH_3NH_3PbI_{3(s)}$ ($MAPbI_3$) growth in solution. (Fu, Y.; Meng, F.; Rowley, M. B.; Thompson, B. J.; Shearer, M. J.; Ma, D.; Hamers, R. J.; Wright, J. C.; Jin, S., Solution Growth of Single Crystal Methylammonium Lead Halide Perovskite Nanostructures for Optoelectronic and Photovoltaic Applications. *J Am Chem Soc* 2015, 137 (17), 5810-5818) The binding sites of $MAPbI_3$ are determined by the coordination of solvent ligands (Manser, J. S.; Saidaminov, M. I.; Christians, J. A.; Bakr, O. M.; Kamat, P. V., Making and Breaking of Lead Halide Perovskites. *Accounts Chem Res* 2016, 49 (2), 330-338). Nevertheless, all these acid-treated solution growth techniques use toxic solvents at still relatively high temperatures. The purity of the product is also another challenge due to the use of an ionic liquid scaffold or salt contamination in resulting perovskites.

Consequently, there is a substantial need to eliminate annealing processes and the use of toxic solvents during perovskite growth while providing easy processing and avoiding possible chemical reactions between ETL and perovskites.

SUMMARY

Embodiments described herein relate generally to method of forming a lead halide perovskite comprising: dissolving an organic halide precursor in a polar protic solvent; dissolving an lead halide precursor in the solvent to form a reaction solution; reacting the organic halide precursor and the lead halide precursor at a reaction temperature of the solvent's boiling point; and forming lead halide perovskite crystals.

In some embodiments, a method of forming a perovskite comprising: dissolving an organic halide precursor in an alcohol solvent; dissolving an lead halide precursor in the alcohol solvent; forming a reaction solution having a concentration of dissolved organic halide precursor plus dissolved lead halide precursor of at least 40 wt % and the reaction solution having a temperature about alcohol solvent's boiling point; reacting the organic halide precursor and the lead halide precursor; and forming lead halide perovskite crystals.

In some embodiments, A method of forming a perovskite film on a substrate comprising depositing a plurality of lead halide perovskite crystals on a substrate.

It should be appreciated that all combinations of the foregoing concepts and additional concepts discussed in greater detail below (provided such concepts are not mutually inconsistent) are contemplated as being part of the subject matter disclosed herein. In particular, all combinations of claimed subject matter appearing at the end of this disclosure are contemplated as being part of the subject matter disclosed herein.

BRIEF DESCRIPTION OF DRAWINGS

The foregoing and other features of the present disclosure will become more fully apparent from the following description and appended claims, taken in conjunction with the accompanying drawings. Understanding that these drawings depict only several implementations in accordance with the disclosure and are therefore, not to be considered limiting of its scope, the disclosure will be described with additional specificity and detail through use of the accompanying drawings.

FIG. 10A illustrates XRD studies performed at different temperatures (20-150° C.) and reaction time (4-48 hrs).

FIG. 10B represents XRD studies performed at different temperatures (20-80° C.) and reaction time (1 h-48 hrs).

Figure 1:
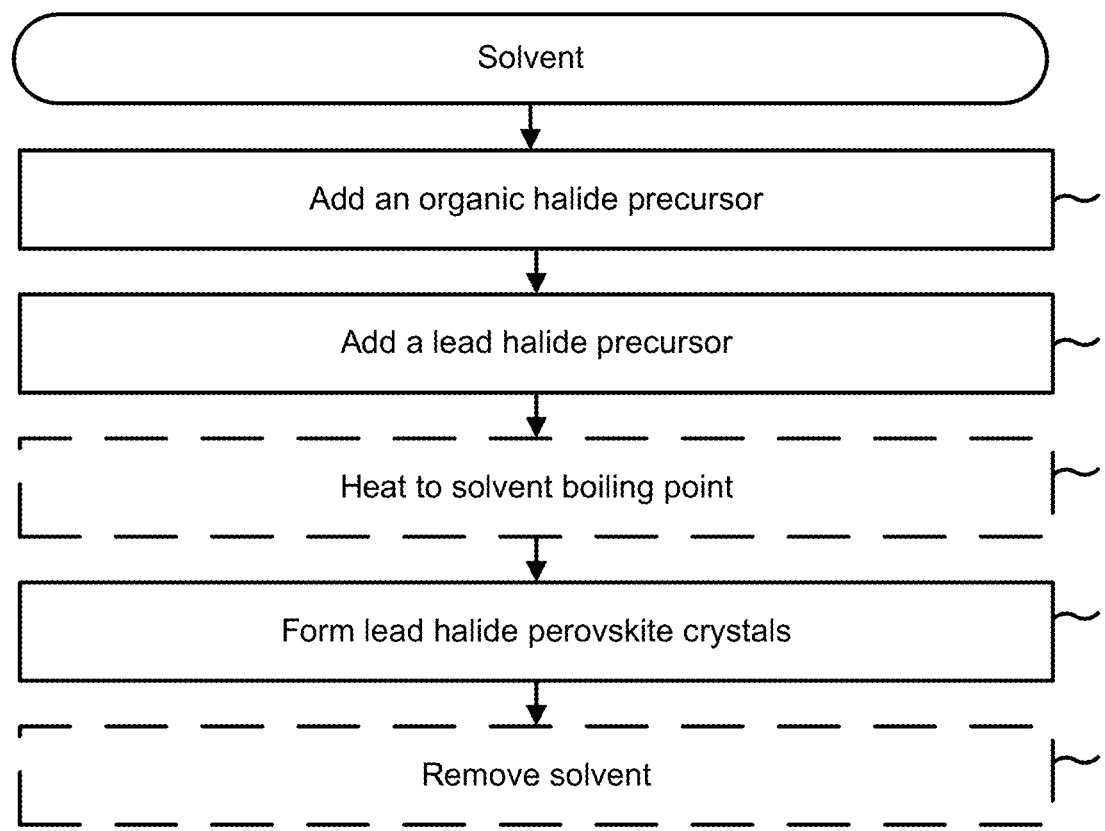
FIG. 1 illustrates one embodiment of a method of forming $MAPbI_3$ perovskite material.
Figure 2:
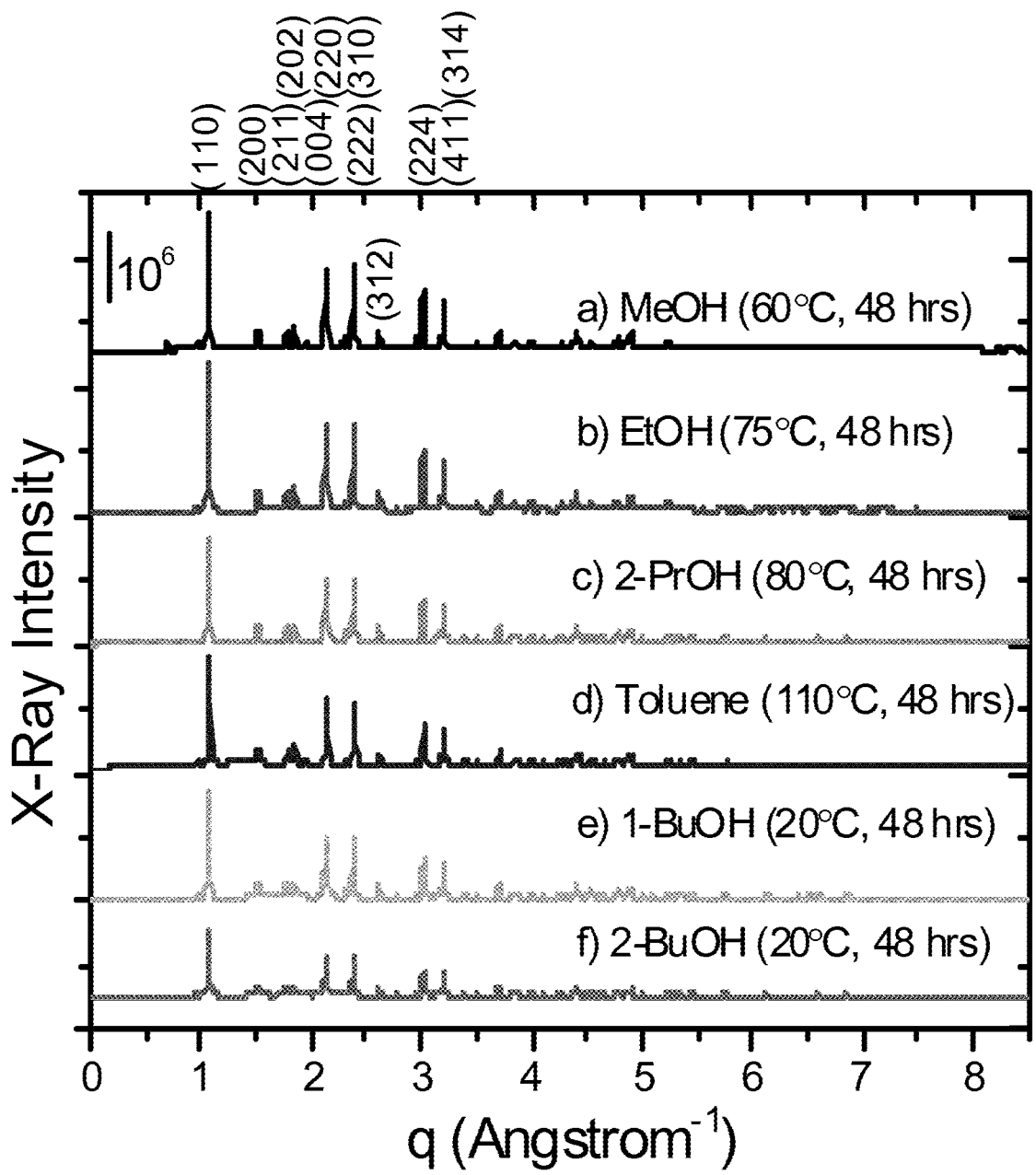
FIG. 2. Illustrates a graph of high-energy synchrotron XRD data for $MAPbI_3$ perovskite growth in a number of different solvents (A-F) at the noted temperatures for 48 hours.
Figure 3A:
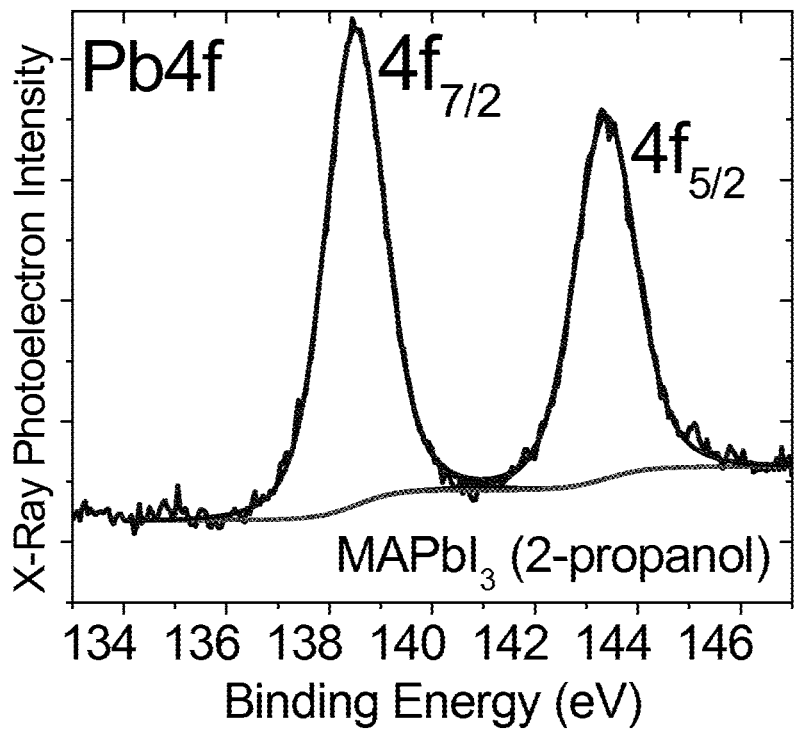
FIG. 3A shows Pb4f X-ray photoelectron spectrum (XPS) with $4f_{7/2}$ and $4f_{5/2}$ bands at 138.8 and 143.7 eV, respectively, for one embodiment of in situ growth of $MAPbI_3$ perovskite in 2-propanol at 80° C.
Figure 3B:
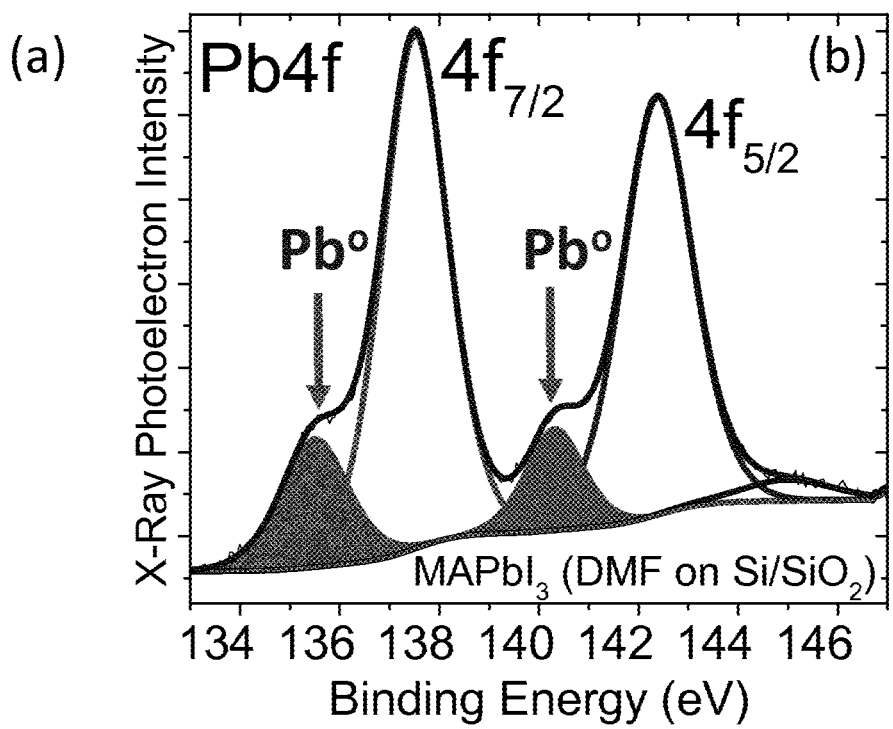
FIG. 3B shows Pb4f XPS for $MAPbI_3$ perovskite growth using a conventional one-step method for crystal formation prepared from DMF deposited on a $Si/SiO_2$ substrate and annealed at 130° C., with $4f_{7/2}$ and $4f_{5/2}$ bands at 138.8 and 143.7 eV, respectively. $Pb^0$ bands are given at 136.9 eV and 141.8 eV.
Figure 4:
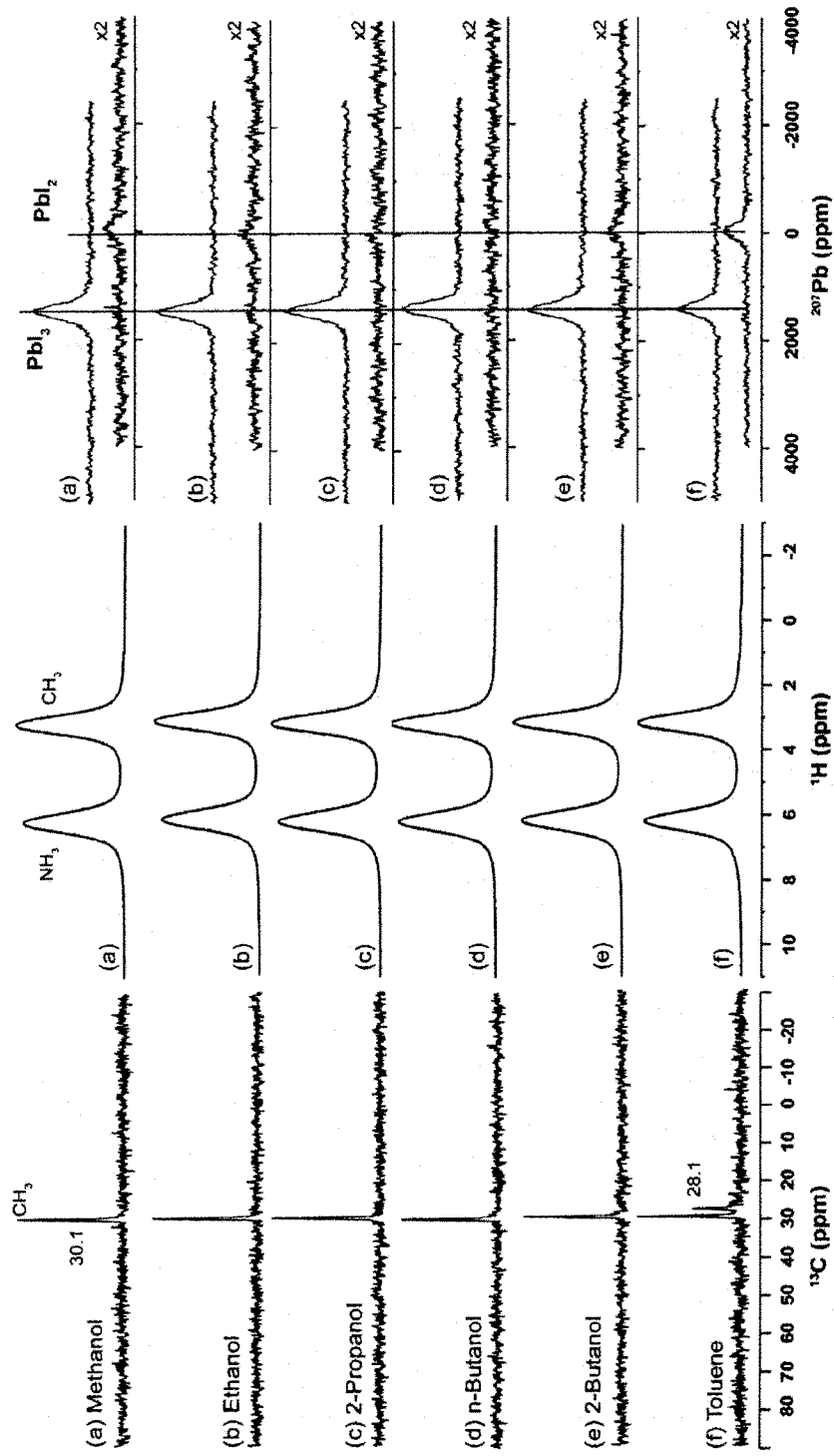
FIG. 4 (i-iii) compares solid-state NMR ($^{13}C$, $^{1}H$, $^{207}Pb$) quantitative results for $MAPbI_3$ perovskite crystals showing $CH_3$, $CH_3$ and $NH_3$ and $PbI_3$ and $PbI_2$ components, respectively.
Figures 5A, 5B, 5C, 5D, 5E, 5F:
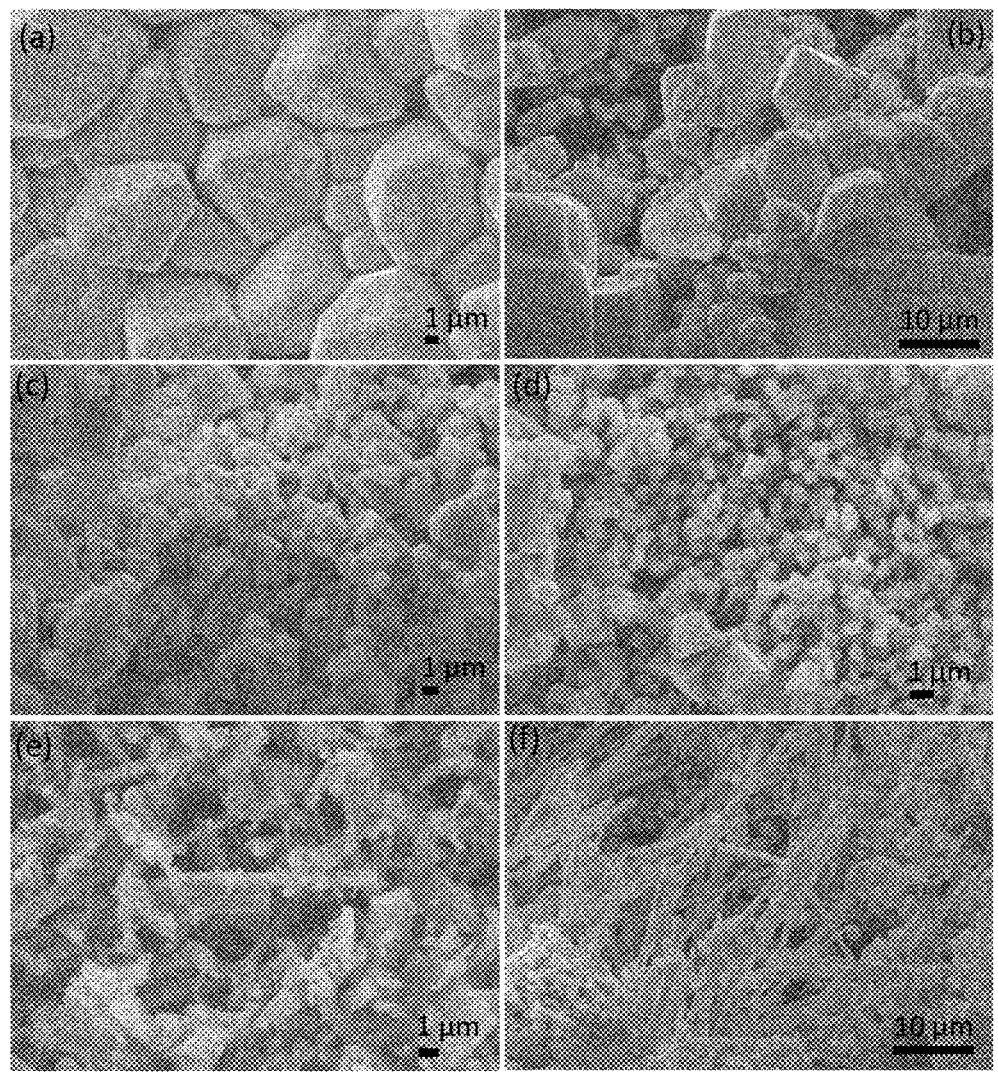
FIGS. 5A-5F show SEM images of $MAPbI_3$ crystal morphology prepared from methanol (FIG. 5A), ethanol (FIG. 5B), 2-propanol (FIG. 5C), 1-butanol (FIG. 5D), 2-butanol (FIG. 5E), and toluene (FIG. 5F), respectively.
Figure 6A:
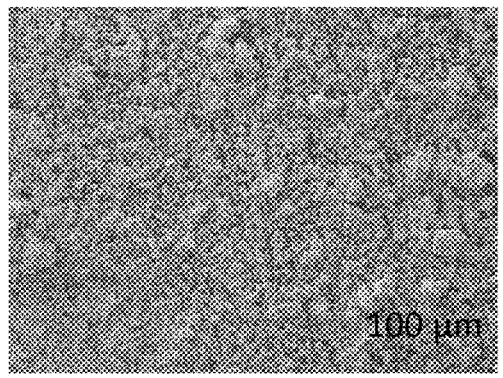
FIGS. 6A-6F show SEM images of $MAPbI_3$ on a large area scale prepared from (a-f) methanol (FIG. 6A), ethanol (FIG. 6B), 2-propanol (FIG. 6C), 1-butanol (FIG. 6D), 2-butanol (FIG. 6E), and toluene (FIG. 6F), respectively.
Figure 6B:
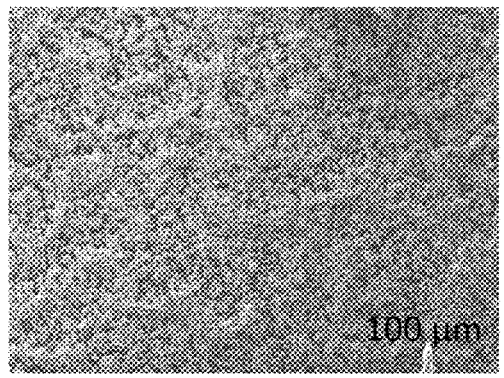
Figure 6C:
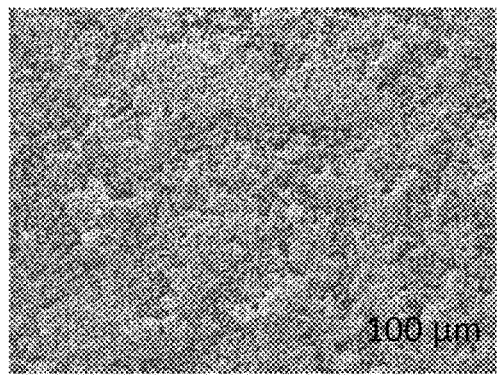
Figure 6D:
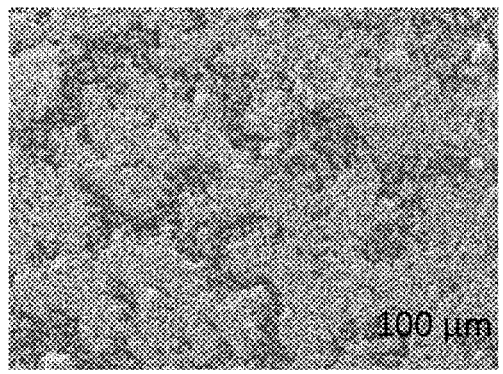
Figure 6E:
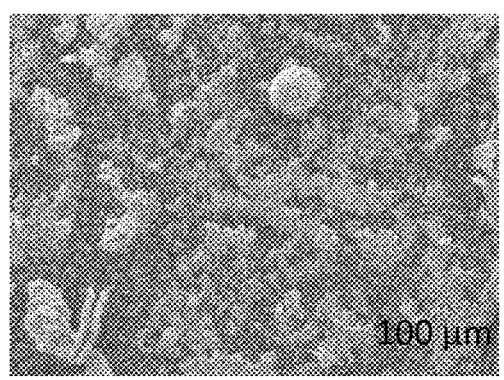
Figure 6F:
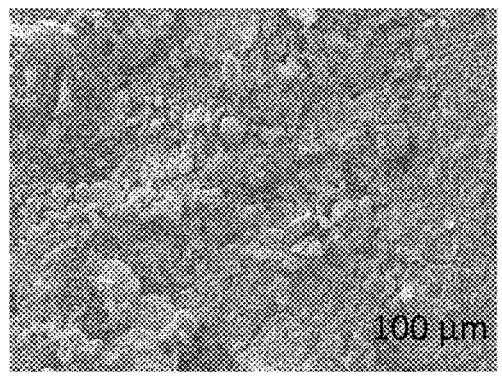
Figure 7:
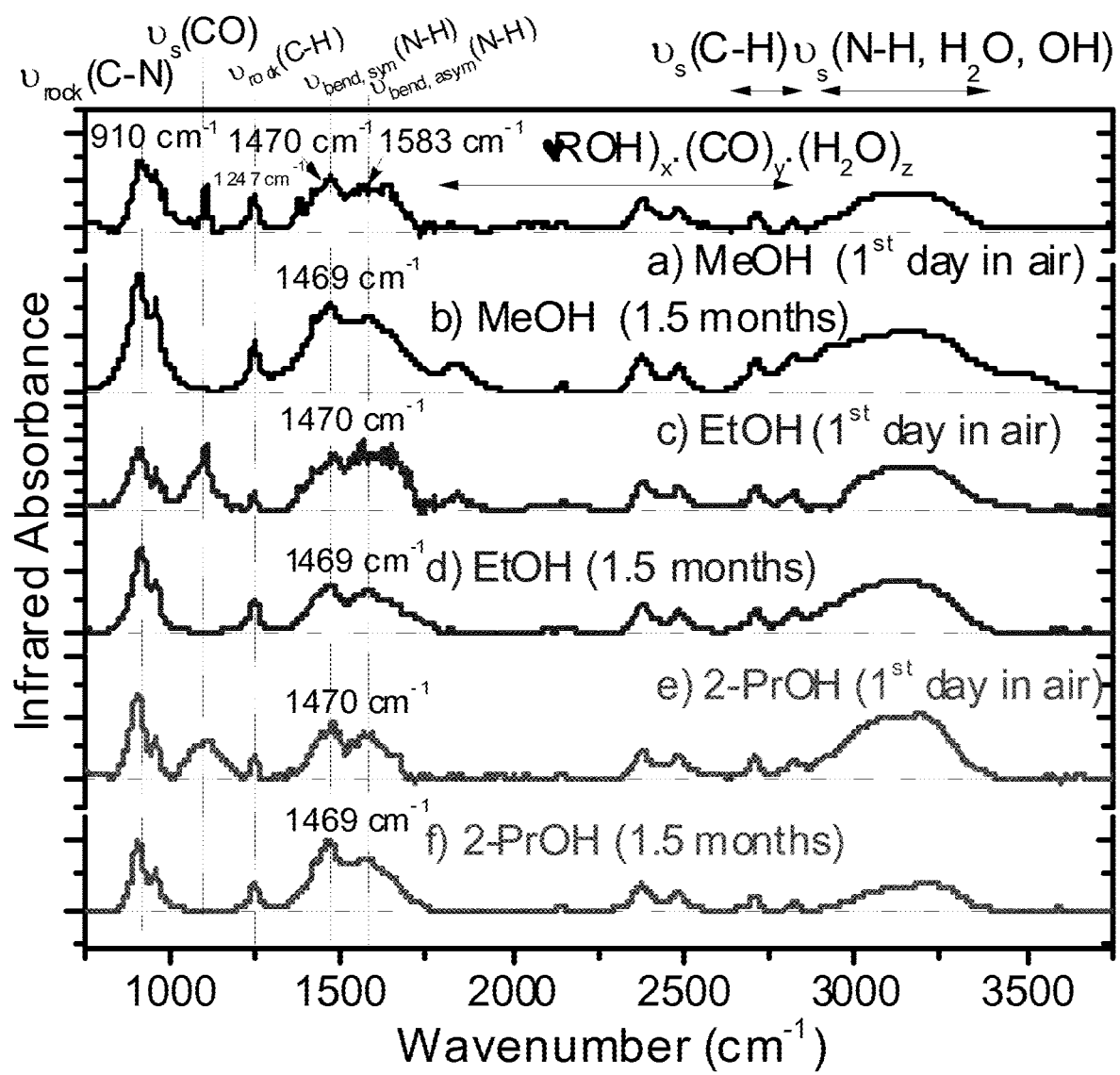
FIG. 7 is a graph of Fourier transform infrared absorption spectrum in transmission mode for various formulations demonstrating relative chemical stability in air.
Figure 8:
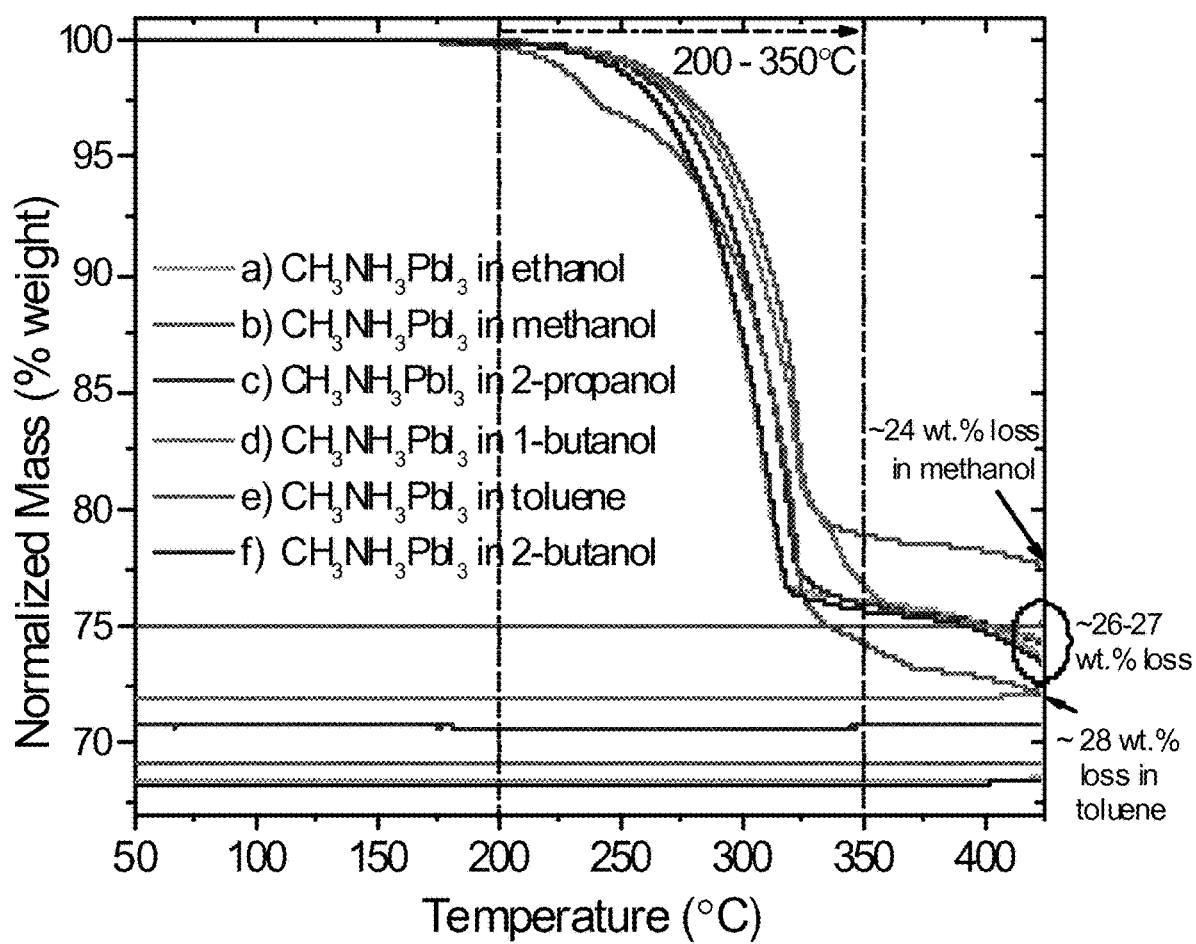
FIG. 8 is a graph of thermogram from thermogravimetric analysis (normalized mass in percentage (%) as a function of temperature at 50-450° C.) for various formulations.
Figure 9:
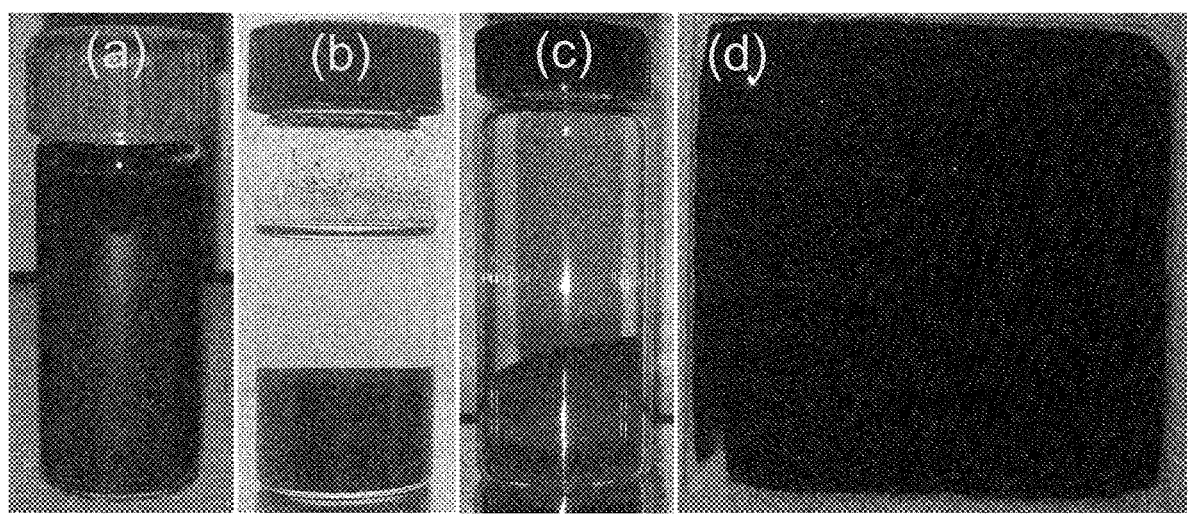
FIG. 9 is an image of $MAPbI_3$ crystals in 2-propanol (a) as a dispersion at room temperature, (b) after tetragonal orientation at 80° C. and precipitated after cooling to room temperature, (c) after separation of 2-propanol resulting in dry powders, and (d) spin-coated $MAPbI_3$ particulates from 2-propanol solution on a glass substrate (without annealing).

Reference is made to the accompanying drawings throughout the following detailed description. In the drawings, similar symbols typically identify similar components, unless context dictates otherwise. The illustrative implementations described in the detailed description, drawings, and claims are not meant to be limiting. Other implementations may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and made part of this disclosure.

DETAILED DESCRIPTION OF VARIOUS EMBODIMENTS

As used herein, "micron scale", "micro scale", and the like mean having a size of 1.0 microns to 1000 microns. As used herein, "nanometer scale", "nano scale", and the like mean having a size of 1.0 nanometers to 1 micron.

Embodiments described herein relate to methods for forming perovskite material by solution processing an organic precursor with an inorganic precursor in a polar protic solvent (i.e. alcohols). For example, described herein are methods for producing methyl ammonium lead halide in polar protic alcohols by focusing on methyl ammonium lead iodide ($MAPbI_3$) perovskite material. More specifically, some embodiments relate to a "one-step solution" method. In one embodiment, the one-step solution processing method via in situ substrate-free growth to produce $MAPbI_3$ perovskite crystals. The $MAPbI_3$ crystals may be micron to nano scale, such as dispersable $MAPbI_3$ crystals. The same method can be applied to produce other type of methyl ammonium lead halides using appropriate precursors resulting in perovskites such as; methyl ammonium lead bromide ($MAPbBr_3$) and methyl ammonium lead chloride ($MAPbCl_3$). The growth method is explained relative to perovskite growth in toluene, which is provided for reference. The materials produced by the methods described herein may be used, for example, in a broad set of solar-layered materials for photovoltaic applications, as semiconductors for the organic LEDs in optoelectronics and nanoscale photonics, photodetectors, lasers, water splitting photocatalysts and thermoelectrics, derived from inexpensive precursors. This method produces tetragonally-oriented $MAPbI_3$ powders from an alcohol-assisted processing method in one-step. Films can be formed from such $MAPbI_3$ crystals.

More particularly, the invention essentially introduces an in situ preparation technique for a group of methylammonium lead halide (for example, iodide, bromide or chloride) perovskite crystals or their mixed halides through a one-step growth method which presents a substrate-free approach leading to a crystal pre-growth without annealing for a large-area deposition and a high scale production. One embodiment relates to a temperature-assisted in situ crystallization method based on varying experimental conditions such as temperature, time, solution concentration and choice of the solvent.

In one embodiment, an immediate crystallization occurs in solution with a control of homogeneous crystal growth upon mixing precursors in a solvent followed by a direct precipitation of the perovskite material in solution resulting in dispersions. The solvent is removed leaving perovskite powder.

In particular, the one-step crystallization method may utilize a combination of organic, such as an organic halide, (e.g., methyl ammonium iodide, MAI, $CH_3NH_3I$) and inorganic, such as an inorganic halide (e.g., lead iodide, $PbI_2$) precursors. The same method can be used to make $MAPbBr_3$ perovskite using methyl ammonium bromide (MABr) and lead bromide ($PbBr_2$), and $MAPbCl_3$ perovskite using methyl ammonium chloride (MACl) and lead chloride ($PbCl_2$). The precursors are dissolved in an alcohol, including methyl, ethyl, isopropyl, 1-butyl and 2-butyl. For the reference samples the solvent used was toluene (a non-polar solvent), dimethylformamide (DMF) and dimethylsulfoxide (DMSO).

Figure 10A:
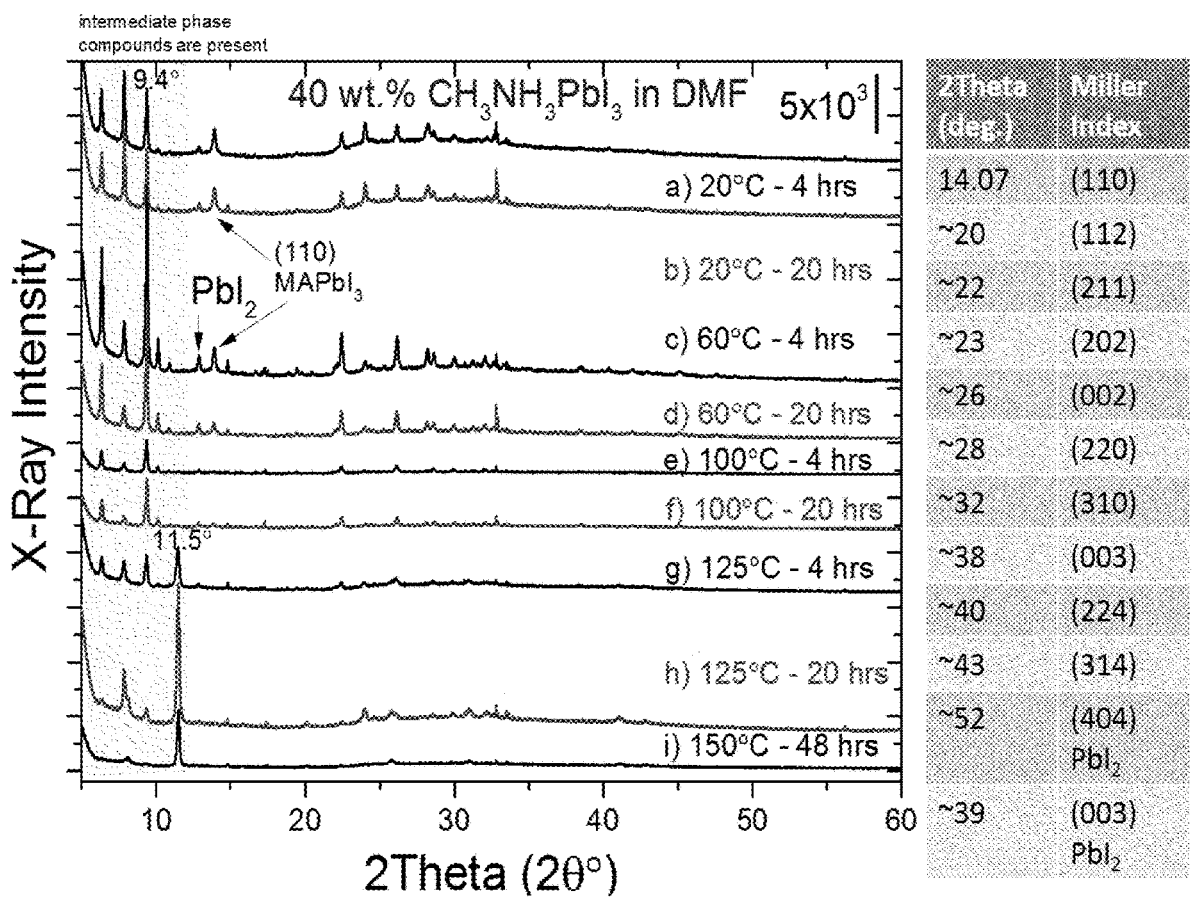
FIG. 10A shows powder XRD studies for $MAPbI_3$ growth prepared in DMF as a control experiment.
Figure 10B:
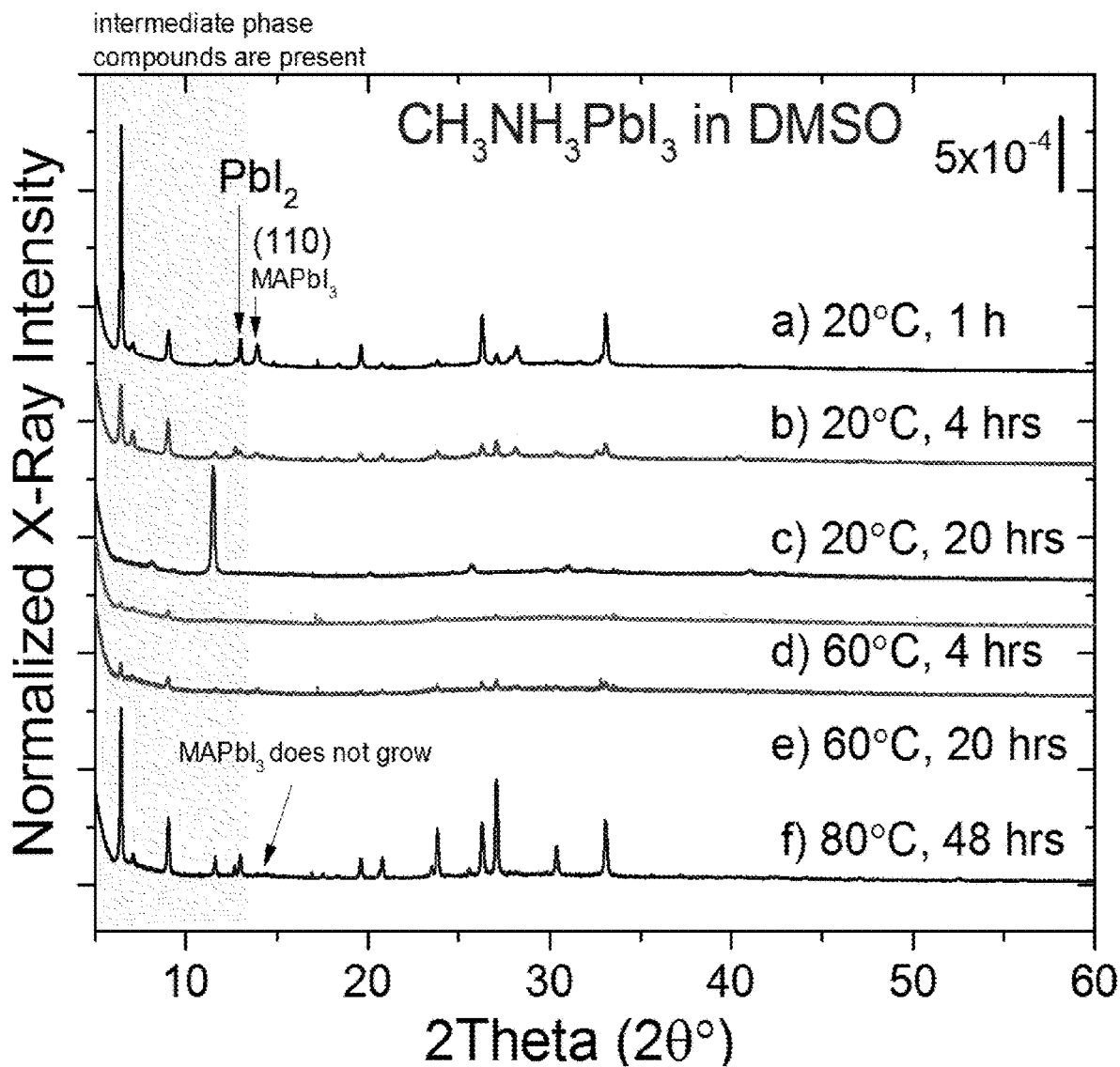
FIG. 10B illustrates powder XRD studies for $MAPbI_3$ growth prepared in DMSO as a control experiment.

In one embodiment, methylammonium iodide ($CH_3NH_3I$) and lead (II) iodide ($PbI_2$) are introduced at a molar ratio of 1:1 into each anhydrous solvent (for example, methanol, ethanol, 2-propanol, 1-butanol, 2-butanol, and, for comparison, toluene) at a dispersion concentration of 40 wt. %, stirred for 48 hrs. at the boiling points except for 1-butanol and 2-butanol. The black color is observed as soon as mixing precursors at room temperature, however unreacted $PbI_2$ is monitored by XRD analysis. In order to achieve $MAPbI_3$ growth at a high yield, the reaction needs to take place at the boiling point of each alcohol. The resulting $MAPbI_3$ dispersion is measured as pH~3-4 without adding any acid. Later, the solvent is discarded from the resulting dispersion at room temperature after cooling the solution in nitrogen environment. The powders are further dried in nitrogen, and also kept in vacuum for 3-4 days to obtain powder crystals. The reaction does not happen at a high $MAPbI_3$ yield when the mass concentration is <40 wt. % in alcohols. When polar aprotic solvents such as dimethyl formamide (DMF) and dimethyl sulfoxide (DMSO) are employed, only the intermediate phases and unreacted $PbI_2$ are observed with conditions of 40 wt. % of concentration at a 1:1 molar ratio of MAI and $PbI_2$ precursors that is heated at 150° C. (DMF, FIG. 10A) and at 80° C. (DMSO, FIG. 10B). In contrast to the alcohols, perovskite conversion efficiency is found to be relatively low in toluene. $MAPbI_3$ is found in toluene as soon as the precursors are mixed at room temperature that are visually observed with a black color. However, intermediate phase compounds and significant amount of unreacted $PbI_2$ (~41% from ssNMR spectral fits, Table 1) are present, even for those prepared at 110° C. $MAPbI_3$ growth in DMF and DMSO also resulted in a very low yield having unreacted $PbI_2$ and intercalation compounds at a large amount (FIGS. 10A-B).

The solution then experiences a direct precipitation of the perovskite material in a dispersion leading to the formation of perovskite crystal. The crystal material may be isolated as a powder material once the solvent is removed, such as by first discarding by a Pasteur pipette in an inert environment, such as a nitrogen environment, and then the alcohol is vaporized to dry the powder in vacuum for 4-5 days. The crystal morphology of $MAPbI_3$ is characterized by SEM (See FIGS. 5A-F and 6A-F), which is highly related to the alcohol reactivity order. The observed grain size variation indicates that as the binding affinity of the alcohol is lowered, the crystal size is reduced from microns to nano scales. For SEM, $MAPbI_3$ dispersions are spin-coated from each dispersion on a carbon tape at a large area without sonication. The size of the grains is largest when methanol is used (~≥10 µm), while their grain size is substantially smaller for all other alcohols. The crystals from ethanol are in a range less than ≤10 µm that are mostly in the range of ≥200 nm up to 1 µm, ≥1 µm (with small crystals between 200-500 nm) for 2-propanol, and 100-500 nm for 1-butanol, respectively. $MAPbI_3$ grown in relatively lower reactivity solvents, 2-butanol and toluene; platelets or fiber-like crystals are obtained. Considering the fiber-like morphology of $PbI_2$, which is the precursor, the presence of fibers in $MAPbI_3$ powder from toluene indicates the large amount of unreacted $PbI_2$.

In one specific implementation, a solution growth technique thereby allows formation of methylammonium lead halide perovskites. In one such embodiment, the perovskite are formed in solution resulting a pH −3-4), when the precursors are mixed at a concentration of 40 wt. %, heated to the solvent boiling point (60° C. for methanol, 85° C. for ethanol, 80° C. for 2-propanol, 110° C. for toluene), for example in a glass vial sealed with a teflon cap, and are further cooled down to the room temperature. At 10 wt. % of solution concentration, $MAPbI_3$ crystals are not present in methanol even though heated at the boiling point of 60° C. (slide 12). $MAPbI_3$ crystals form at 20-40 wt. % of solution concentration, however the reaction results in formation of intermediate phases and unreacted $PbI_2$. To minimize unreacted $PbI_2$ and increase the product yield, 40 wt. % concentration is found to be the possible highest saturated concentration for $MAPbI_3$ growth. Although $MAPbI_3$ crystals form at ≤60° C. in 2-propanol as an example (slide 13), intermediate by-products and unreacted $PbI_2$ are present. The crystallization occurs at a higher yield at 60° C. without showing any intermediate phase however there is remaining unreacted $PbI_2$. For this reason, the solvent boiling point (80° C.) is the best process condition to obtain a tetragonal orientation of $MAPbI_3$ in 2-propanol with minimized unreacted

TABLE 1

$^{207}Pb$ NMR spectral parameters.

| | $CH_3NH_3PbI_3$ | | | $PbI_2$ | | |
|---|---|---|---|---|---|---|
| Sample | δ (ppm) | FWHM (kHz) [FWHM (ppm)] | Fraction (%) | δ (ppm) | FWHM (Hz) [FWHM (ppm)] | Fraction (%) |
| Methanol | 1415 ± 5 | 26.6 [318] | 90 | Fixed | Fixed | 10 |
| Ethanol | 1413 ± 5 | 24.6 [293] | 85 | Fixed | Fixed | 15 |
| 2-Propanol | 1416 ± 5 | 25.2 [300] | 96 | Fixed | Fixed | 4 |
| 1-Butanol | 1434 ± 5 | 24.9 [298] | 99 | Fixed | Fixed | 1 |
| 2-Butanol | 1414 ± 5 | 25.5 [305] | 89 | Fixed | Fixed | 11 |
| Toluene | 1416 ± 5 | 25.6 [306] | 59 | −32.7 | 25.6 [305] | 41 |

PbI$_2$. For MAPbI$_3$ growth in 1-butanol and 2-butanol, tetragonal orientation of crystals is observed at room temperature after mixing for 48 hrs. Therefore, these reaction only takes place without applying any heat. The purity of the precursors, their anhydrous nature and solubility, polarity of the alcohol, the reaction concentration, time and type of alcohol are critical parameters for the reaction yield to increase. In one embodiment, the reaction temperature is kept at the boiling point of the alcohol(s) (or, generally, the solvent), in one embodiment the reaction temperature is plus/minus 0%-25% (inclusive) of the boiling point.

Perovskite growth is also possible at room temperature using 1-butanol or 2-butanol under continuous stirring via a continuous nitrogen purge in a glove box. It has been observed from the remaining amount of alcohol after the reaction indicates that the alcohol reacts with the precursors, particularly with MAI through a hydrogen bond formation for MAPbI$_3$ growth. Nevertheless, the alcohol is not consumed in the reaction, instead catalyzes the reaction to proceed with a high yield of perovskite formation. Once the solvent is removed, such as by evaporation through a continuous stirring in nitrogen environment in the glass vial for 4-5 days, the resulting dry powder is further dried in a vacuum desiccator overnight for a complete solvent removal. Consequently, the color of the resulting perovskite solution and the dry powder are black for methylammonium lead iodide. The same general reaction can form methylammonium lead bromide and methylammonium lead chloride, with the appropriate precursors as noted herein, and result in orange and pale yellow colors, respectively.

In one embodiment, a solution growth technique results in dispersive perovskite crystals in alcohols that not only eliminates deposition of a film onto a substrate and avoids heating to induce crystallization on the substrate, and air/thermal stability of the perovskite crystals.

In one embodiment, the method utilizes a solvent. The use of a variety of low boiling point alcohols (20-80° C.) is also advantageous over high boiling point solvents such as dimethylformide ("DMF"). For example, due to the low boiling point of methanol, ethanol and 2-propanol, the preparation method is easy to dry, attributed to high volatility of such alcohols, environmentally benign, free from high levels of solvent toxicity as compared to other solvents such as benzene, chloroform, etc.

While a substrate is not required for the formation of perovskite as described above, the resultant perovskite materials can be deposited on a substrate. In one embodiment, perovskite crystal dispersions can be deposited on a flexible or bendable substrates (for example, but not limited to plastics, mica, etc.) through inexpensive techniques such as, but not limited to, spin-coating, spray-coating, paint brush, ink jet printing, drop casting, stamping techniques, etc. Further, the ability to be used on a flexible substrate opens the possibilities for flexible products such as wearables, clothing, smart textiles and the like. Thus, in some embodiments, the in situ technique also provides a complete surface coverage of any desirable substrate with a controlled film thickness and excellent uniformity for flexible solar cell fabrication. Such perovskite dispersions in alcohols can be also readily deposited on rigid substrates such as Si/SiO$_2$, metals, or crosslinked polymers by using the same techniques. To fabricate thin films from these perovskite powders, new methods need to be further explored for various applications.

In addition to use in traditional deposition techniques on flexible or rigid substrates, the perovskite dispersions allow for other uses. For example, the dispersions can be dried and the perovskites stored in the forms of dry powder. Further, perovskites created according to some embodiments can be used with sticky carbon tapes for SEM measurements or on tantalum foils for XPS studies. The perovskite crystals in powders can be redispersed in each specific solvent and used as dispersions as a reverse engineering for required applications.

Further, as embodiments herein can be used to form different perovskites, each as a powder, they can be possibly mixed with other powder materials of TiO$_2$ (electron transport "ETL" layer) or meso-structured TiO$_2$/AlO$_3$ or even direct use with other hole transport layer ("HTL") materials such as graphene oxide or reduced graphene oxide for solar cell applications.

Further, the methods of perovskite material formation may be utilized to provide a perovskite layer on a graphene oxide or reduced graphene oxide substrate, such as a GO or RGO thin film in a solar cell stack. Perovskites, particularly lead halide perovskites, have been shown to exhibit poor formation on GO thin films. It is believed that the graphene oxide reacts with the perovskite during the annealing step of traditional perovskite growth on a thin film. However, the perovskite crystal materials can be deposited on a GO thin film, such as by solution processing through deposition in a solvent and evaporation of the solvent or by other known deposition techniques. Thus, the perovskite is deposited onto the GO rather than grown from precursors on the GO, without the need for an annealing step and voiding the reactive problems presented by such.

Figure 11:
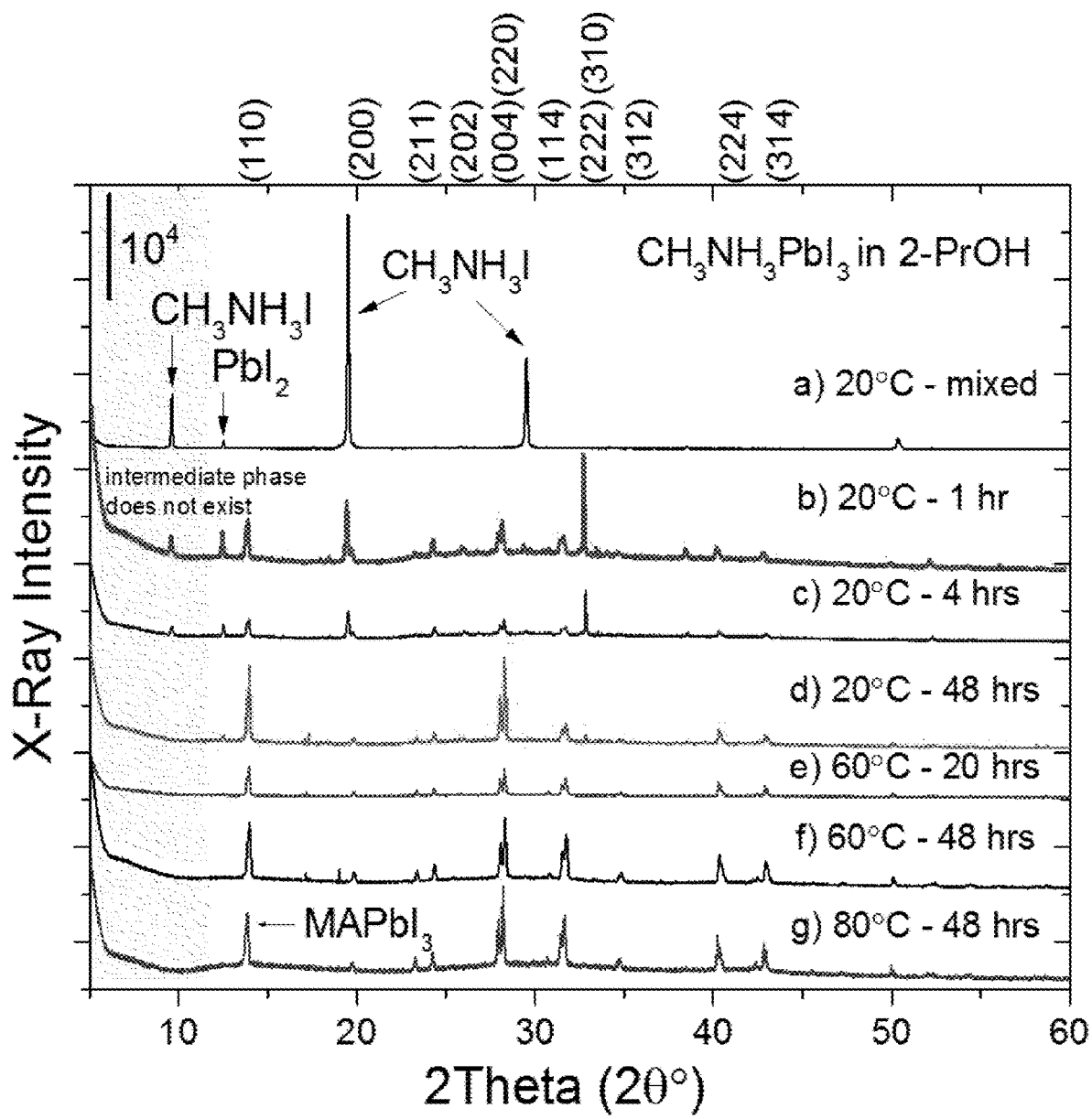
FIG. 11 illustrates powder XRD studies for $MAPbI_3$ growth in methanol prepared at various solution concentration (10-40 wt. %) at 20-60° C. for 48 hrs.
Figure 12:
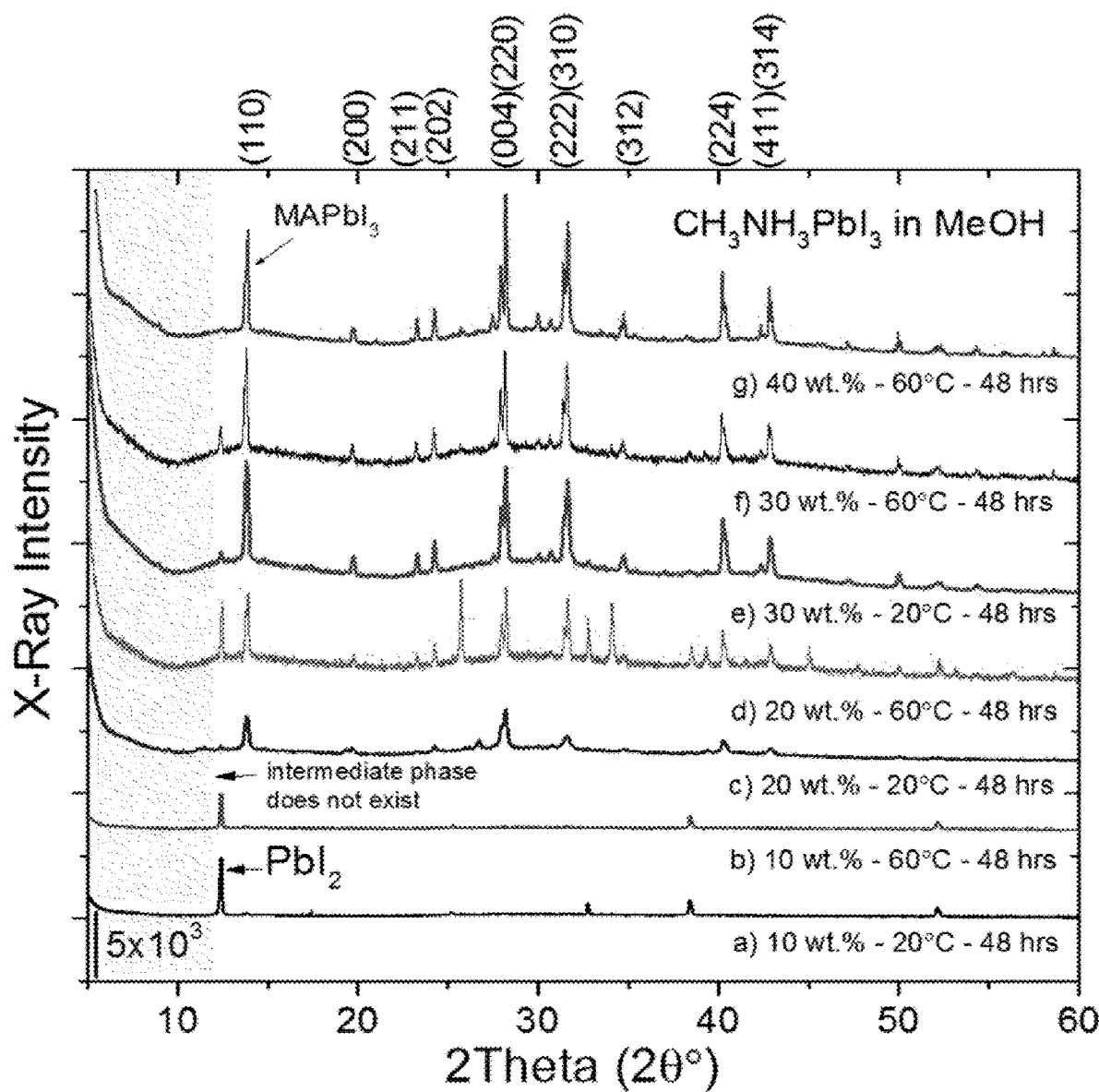
FIG. 12 illustrates powder XRD studies for $MAPbI_3$ growth in 2-propanol prepared at different temperatures (20-80° C.) and growth time (1 h-48 hrs), given as an example for process optimization.

The availability of perovskite materials as both dispersions and as dry powder materials provides for flexibility in analytics and characterization as well. For example, the perovskite materials may be solution processed to broaden the applications available for characterization. For instance, solids are excellent sources for the solid state $^1$H, $^{13}$C, $^{15}$N, and $^{207}$PbNMR techniques to understand their molecular structures, and the powder materials are easy to use for XRD, TGA, ATR and photoluminescence studies. The easy processability as dispersions also provides opportunity for in situ High Energy XRD studies. FIGS. 10A-10B illustrate powder XRD studies for MAPbI$_3$ in DMF (FIG. 10A) and DMSO (FIG. 10B), MAPbI$_3$ in 2-PrOH as a function of solution concentration (FIG. 11), and MAPbI$_3$ in methanol (FIG. 12) to test different temperature and reaction time. The micron-sized particles of these perovskites allow large grain boundaries in a film-like morphology with particulates by simply varying the spin-coating parameters that also leads to a better control of the perovskite deposition. As the binding site availability increases (most difficult with methanol and the easiest with 2-butanol), the particle size is reduced to nanometer scales (~<500 nm). Room temperature formation of perovskites in 1-butanol and 2-butanol also results in avoidance of the heat during crystal growth in solution.

Examples

A number of experiments were undertaken with regard to perovskite formation. Several lead halide perovskites were investigated. Methylammonium lead iodide perovskite is characterized by a black color, Methylammonium lead bromide perovskite is characterized by an orange color. Methylammonium leadchloride perovskite is characterized by a pale yellow color. Mixed halides could also be observed and identified based on color combinations.

Materials:

The precursors, namely, methylammonium iodide (CH3NH3I, Assay: 98%, CAS #14965-49-2, SKU #793493-

5g or 806390-25G), methylammonium bromide ($CH_3NH_3Br$, Assay: 98%, CAS #6876-37-5, SKU #793507-5g or 806498-25g), methylammonium chloride ($CH_3NH_3Cl$, CAS #593-51-1, SKU #8.06020.1000), lead (II) iodide ($PbI_2$, CAS #10101-63-0, SKU #203602-50g, 99.999% trace metals basis from Sigma-Aldrich or CAS #14965-49-2, ITEM #MSIOI000-50 from Dyesol Inc.), lead (II) bromide ($PbBr_2$, CAS #10031-22-8, SKU #398853-5G, 99.999% trace metals basis), and lead (II) chloride ($PbCl_2$, CAS #7758-95-4, SKU #203572-50g, 99.999% trace metals basis) have been purchased from Sigma-Aldrich or Dyesol Inc. The solvents, namely, methyl ($CH_3OH$, anhydrous, Assay: 99.8%, CAS #67-56-1, SKU #322415-100 ml), ethyl ($CH_3CH_2OH$, anhydrous, non-denatured, absolute, 200 proof, Assay: 99.5%, CAS #64-17-5, SKU #459836-100 ml), isopropyl ($CH_3CH(OH)CH_3$, anhydrous, Assay: 99.5%, CAS #67-63-0, SKU #278475-100 ml), 1-butyl ($CH_3CH_2CH_2CH_2OH$, anhydrous, Assay: 99.8%, CAS #71-36-3, SKU #28 1549-100 ml), and 2-butyl ($CH_3CH_2CH(OH)CH_3$, anhydrous, Assay: 99.5%, CAS #78-92-2, SKU #294810-100 ml) alcohols and toluene ($C_6H_5CH_3$, Assay: 99.8%, CAS #108-88-3, SKU #244511-100 ml) have been purchased from Sigma-Aldrich.

The first experiment was performed with trials in DMF for all methylammonium lead iodide/bromide/chloride perovskites and studies continued by searching the role of DMF and understanding the chemical interactions with the precursors (methylammonium iodide/bromide/chloride and lead (II) iodide/bromide/chloride) in DMF, followed by the conventional approach deposited on $Si/SiO_2$ and annealed on a hot plate.

An experiment was undertaken with methylammonium iodide with lead (II) iodide at a concentration of 40 wt. % in 2-propanol at room temperature with overnight stirring in nitrogen environment. A black color, indicative of perovskite formation, was observed. The solvents such as DMSO and DMF were also tested at room temperature with overnight stirring in nitrogen environment but the perovskite formation could not be observed at room temperature.

Additional experiments were done in methanol and ethanol following the same experimental procedure in the case of 2-propanol. The solutions were heated to 60° C. and the time of the experiment was tested for 4 hours and 20 hours of continuous stirring in nitrogen environment. First in situ High Energy Syncrothron XRD tests were performed to evaluate formation of methylammonium lead iodide/bromide/chloride in DMF solution (yellow, colorless, and white, respectively) together with methylammonium lead iodide (black) solutions in 2-propanol prepared at room temperature. Particles of methylammonium lead iodide were noticed in these black solutions in 2-propanol.

Next, methylammonium lead bromide and methylammonium lead chloride perovskite solutions were prepared in methanol, ethanol and 2-propanol at room temperature with an overnight continuous stirring. Orange and pale yellow solution colors were observed.

Solutions were also studied at a concentration of 10, 20 and 30 wt. %. These did not result in a perovskite formation in methanol, ethanol and 2-propanol at a high yield. Further, the experiments were tested for methylammonium lead iodide in toluene at room temperature which did not result perovskite growth at a high yield. However, after heating toluene to near a boiling point of 100-110° C., a black color was observed.

A further experiment prepared methylammonium lead iodide/bromide/chloride solutions in methanol, ethanol, 2-propanol and toluene, prepared at the solvent boiling point overnight. The resultant solution was tested with in situ High Energy Syncrothron XRD.

Methylammonium lead iodide/bromide/chloride perovskite growth was studied in methanol, ethanol and 2-propanol at their boiling points of 60° C., 75° C., and 80° C., respectively for 48 hours of continuous heating and stirring in nitrogen environment which was confirmed as the optimum process condition using XRD upon spin-coating on $Si/SiO_2$.

Methylammonium lead iodide/bromide/chloride perovskite formation was also confirmed in toluene at −110° C. with a 2-day (48 hours) heating and stirring.

Another set of experiments was performed by mixing halides of methylammonium lead iodide/bromide (at a concentration of 40 wt. %, with molar ratios of I to Br at 1:2) methanol, ethanol and 2-propanol at 60° C. for an overnight heating and stirring in nitrogen environment. A black/brown color was followed a dark red color in solution.

In another experiment, methylammonium lead iodide perovskite formation was first observed in 1-butanol and 2-butanol with a black color after mixing at room temperature for 48 hours in nitrogen. Further experiments were performed for methylammonium lead bromide/chloride in 1-butanol and 2-butanol at room temperature with orange and pale yellow colors, respectively. Additional experiments with all samples prepared at their solvent boiling points for 48 hours were tested in solution using High Energy XRD. Mixed halides such as methylammonium lead iodide/bromide, iodide/chloride and bromide/chloride were also studied in all the solvents heated at the boiling point for 48 hours at a solution concentration of 40 wt. % at a halide molar ratio of 1:2, and tested using High Energy XRD. Mixing iodide/bromide, iodide/chloride or bromide/chloride resulted in red, gray, and bright yellow colors in solution, confirming the perovskite formation.

Figure 13:
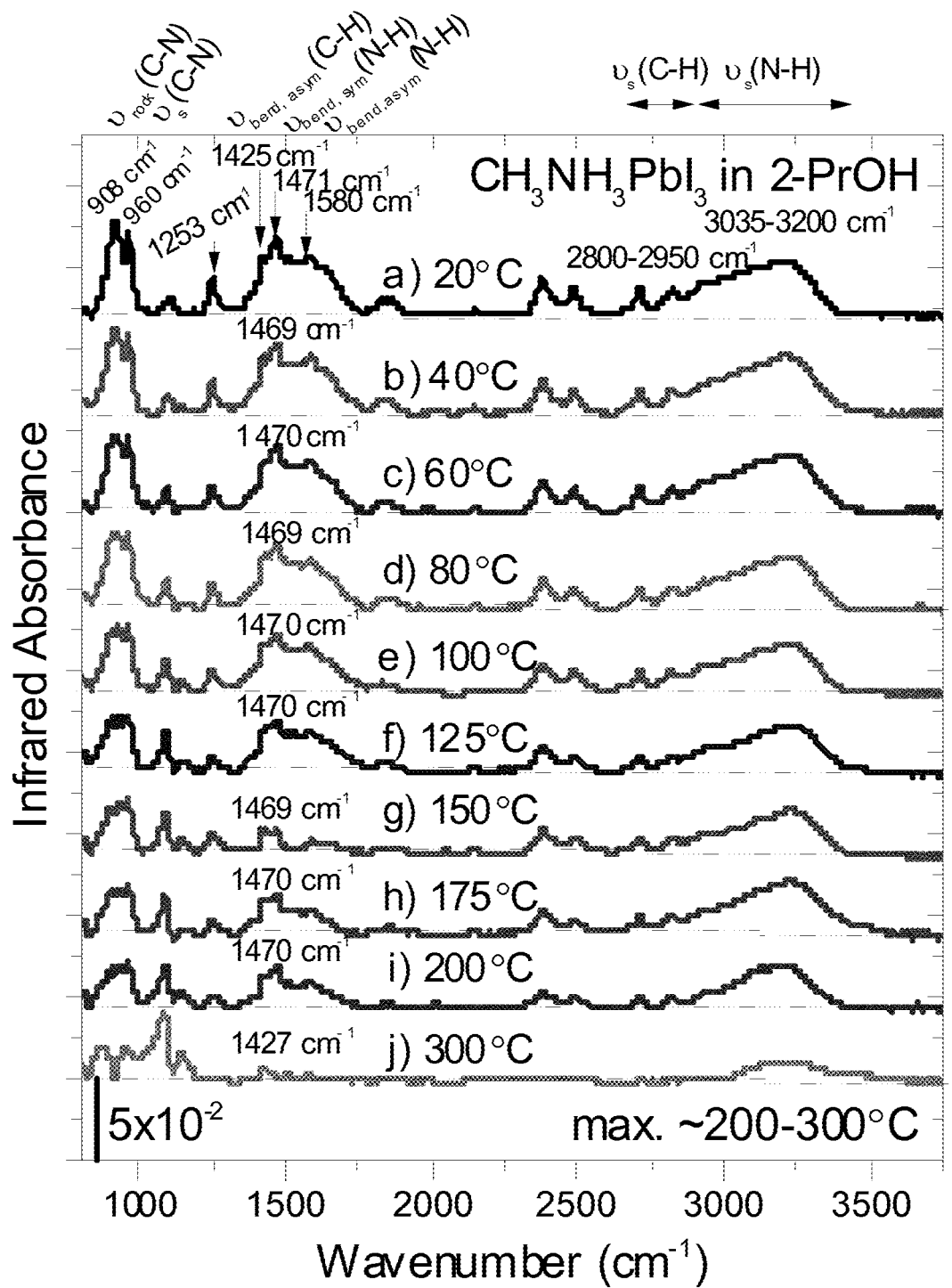
FIG. 13 illustrates in situ transmission infrared absorbance spectra of the spin-coated $MAPbI_3$ on a $Si/SiO_2$ substrate at room temperature (a), further annealed at 40-300° C. in argon (b-j). Each spectrum is referenced to the initial $Si/SiO_2$ spectrum collected at room temperature.

The resulting perovskite material was characterized in solution transferred into a capillary tube sealed by an epoxy in a nitrogen glove box by High Energy Syncrothron XRD techniques. The spin-cast perovskite material is also characterized on a $Si/SiO_2$ substrate by a powder X-Ray technique as well as Fourier Transform Infrared (FTIR) in transmission or reflection geometry (ATR), UV-Vis-NIR (% Reflection), Thermogravimetric Analysis, and Scanning Electron Microscopy. Their air/moisture/humidity tests have been followed by exposing the material to air in a fume hood, and characterized by the FTIR method, see FIG. 13. Indeed, their thermal and chemical stability is studied by in situ FTIR where the material is heated at 20-300° C. for 30 minutes at a ramp rate of 10° C./min. in a continuous nitrogen gas purge. All the measurements were performed at room temperature once the material was cooled down to room temperature under same test conditions with a simultaneous measurements done at a Brewster's angle (70°) with respect to the normal mode operation.

As used herein, the singular forms "a", "an" and "the" include plural referents unless the context clearly dictates otherwise. Thus, for example, the term "a member" is intended to mean a single member or a combination of members, "a material" is intended to mean one or more materials, or a combination thereof.

As used herein, the terms "about" and "approximately" generally mean plus or minus 10% of the stated value. For example, about 0.5 would include 0.45 and 0.55, about 10 would include 9 to 11, about 1000 would include 900 to 1100.

It should be noted that the term "exemplary" as used herein to describe various embodiments is intended to indicate that such embodiments are possible examples, representations, and/or illustrations of possible embodiments (and such term is not intended to connote that such embodiments are necessarily extraordinary or superlative examples).

The terms "coupled," "connected," and the like as used herein mean the joining of two members directly or indirectly to one another. Such joining may be stationary (e.g., permanent) or moveable (e.g., removable or releasable). Such joining may be achieved with the two members or the two members and any additional intermediate members being integrally formed as a single unitary body with one another or with the two members or the two members and any additional intermediate members being attached to one another.

It is important to note that the construction and arrangement of the various exemplary embodiments are illustrative only. Although only a few embodiments have been described in detail in this disclosure, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter described herein. Other substitutions, modifications, changes and omissions may also be made in the design, operating conditions and arrangement of the various exemplary embodiments without departing from the scope of the present invention.

While this specification contains many specific implementation details, these should not be construed as limitations on the scope of any inventions or of what may be claimed, but rather as descriptions of features specific to particular implementations of particular inventions. Certain features described in this specification in the context of separate implementations can also be implemented in combination in a single implementation. Conversely, various features described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

What is claimed is:

1. A method of forming a lead halide perovskite comprising:
   dissolving an organic halide precursor in a polar protic solvent;
   dissolving a lead halide precursor in the solvent to form a reaction solution, the reaction solvent has a concentration of organic halide precursor plus lead halide precursor of at least 40 wt %;
   reacting the organic halide precursor and the lead halide precursor at a reaction temperature of the solvent's boiling point between 60° C. and 85° C. for at least 48 hours; and
   precipitating tetragonally-orientated lead halide perovskite crystals free of a substrate.

2. The method of claim 1, wherein the organic halide precursor is selected from methylammonium chloride, methylammonium iodide, and methylammonium bromide.

3. The method of claim 1, wherein the lead halide precursor is selected from lead chloride, lead iodide, and lead bromide.

4. The method of claim 1 wherein the organic halide precursor and the lead halide precursor each comprise an identical halide.

5. The method of claim 1, wherein the organic halide precursor and the lead halide precursor are present in substantially a 1:1 molar ratio in the solvent prior to reacting.

6. The method of claim 1, wherein the polar protic solvent is an alcohol.

7. The method of claim 1, further comprising evaporating the solvent after precipitation of lead halide perovskite crystals.

8. The method of claim 7, wherein the evaporation is in an inert environment.

9. The method of claim 1, wherein within 20%+/− of the boiling point comprises at the boiling point.

10. A method of forming a perovskite comprising:
    dissolving an organic halide precursor in an alcohol solvent, the alcohol solvent comprising methanol, ethanol, 2-propanol, 1-butanol, or 2-butanol;
    dissolving a lead halide precursor in the alcohol solvent;
    forming a reaction solution having a concentration of dissolved organic halide precursor plus dissolved lead halide precursor of at least 40 wt % and the reaction solution having a temperature about an alcohol solvent boiling point, the alcohol solvent boiling point being: a) between 60° C. and 85° C. for methanol, ethanol, and 2-propanol; or b) at least 20° C. for 1-butanol or 2-butanol;
    reacting the organic halide precursor and the lead halide precursor for at least 48 hours; and
    precipitating tetragonally-orientated lead halide perovskite crystals free of a substrate.

11. The method of claim 10, wherein the organic halide precursor is selected from methylammonium chloride, methylammonium iodide, and methylammonium bromide.

12. The method of claim 10, wherein the lead halide precursor is selected from lead chloride, lead iodide, and lead bromide.

13. The method of claim 10 wherein the organic halide precursor and the lead halide precursor each comprise an identical halide.

14. The method of claim 10, wherein the organic halide precursor and the lead halide precursor are present in substantially a 1:1 molar ratio in the solvent prior to reacting.

15. The method of claim 10, further comprising evaporating the solvent after precipitation of lead halide perovskite crystals.

* * * * *